United States Patent
Ye et al.

(10) Patent No.: US 6,515,513 B2
(45) Date of Patent: Feb. 4, 2003

(54) REDUCING LEAKAGE CURRENTS IN INTEGRATED CIRCUITS

(75) Inventors: Yibin Ye, Portland, OR (US); James W. Tschanz, Hillsboro, OR (US); Vivek K. De, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/846,604

(22) Filed: Apr. 30, 2001

(65) Prior Publication Data

US 2002/0158665 A1 Oct. 31, 2002

(51) Int. Cl.[7] .................. H03K 19/0175; H03K 19/096
(52) U.S. Cl. .......................................... 326/83; 326/95
(58) Field of Search ........................... 326/83, 119, 121, 326/122, 93, 95–98

(56) References Cited

U.S. PATENT DOCUMENTS

| 5,583,457 A | * 12/1996 | Horiguchi et al. ........... 326/121 |
| 5,999,019 A | * 12/1999 | Zheng et al. .................. 326/98 |
| 6,154,045 A | 11/2000 | Ye et al. ........................ 326/17 |
| 2002/0008999 A1 | * 1/2002 | Hidaka ........................ 365/200 |

OTHER PUBLICATIONS

Shin ichiro Mutoh et al. 1–V Power supply High–Speed Digital Circuit Technology with Multithrehold–Voltage CMOS, IEEE Journal of Solid–State Circuits, vol. 30, No. 8, Aug., 1995.

Hiroki Morimura et al. A Step–Down Boosted–Wordline Scheme for 1–V Battery–Operated Fast SRAM's, IEE Journal of Solida–State Circuits, vol. 33, No. 8, Aug. 1998.

Y. Oowaki et al. "TP 6.2: A Sub–0.1 $\mu$m Circuit Design with Substrate–over–Biasing", 1998 IEEE International Solid-State Circuits Conference, First Edition, IEEE Catalog No., 98CH36156, Feb., 1998.

* cited by examiner

Primary Examiner—Michael Tokar
Assistant Examiner—James H Cho
(74) Attorney, Agent, or Firm—Fish & Richardson P.C.

(57) ABSTRACT

A method and apparatus for reducing leakage current in an integrated circuit includes a supply voltage line, a virtual supply voltage line, a ground voltage line, a virtual ground voltage line, a first logic circuit coupled to the ground voltage line and selectively coupled to the virtual supply voltage line, a second logic circuit coupled to the supply voltage line and selectively coupled to the virtual ground voltage line, and a switch circuit configured to control the selective coupling of the first logic circuit to the virtual supply line voltage and the second logic circuit to the virtual ground voltage line.

14 Claims, 3 Drawing Sheets

REDUCING LEAKAGE CURRENTS IN INTEGRATED CIRCUITS

TECHNICAL FIELD

This invention relates to reducing leakage currents in integrated circuits.

BACKGROUND

Standby leakage current is the current which may flow through a logic circuit when a transistor within the circuit is at high impedance and attempting to hold an output voltage at a certain level. Standby leakage current can cause a loss of the signal output and can also increase power consumption of the logic circuit.

Referring to FIG. 1, an approach to reducing standby leakage current in CMOS circuits was proposed in Mutoh, et al., "1-V Power Supply High-Speed Digital Circuit Technology with Multithreshold-Voltage CMOS", IEEE Journal of Solid-State Circuits, Vol. 30, No.8, August 1995, pp. 847–854. Mutoh, et al, proposed a CMOS logic circuit 100 including a series of CMOS logic gates 102A–102B. Logic circuit 100 includes 'sleep' transistors Q1 and Q2, which are connected between the supply voltage, Vdd, and common ground, GND, respectively, to establish 'virtual' supply lines, VDDV and GNDV. The source terminals 104A–104B of the p-block transistors of each CMOS logic gate 102A–102B are connected to VDDV, while the source terminals 106A–106B of the n-block transistors are connected to GNDV. By P-block (or N-block) is meant a circuit that includes one or more p-channel (or n-channel) transistors.

In operation, in 'sleep mode', SL 120 is at logic-level '1', which turns off the sleep transistors Q1 and Q2 and cuts off the leakage current that would otherwise pass through the logic gates 102A–102B. In 'active mode', SL 120 is at logic-level '0', turning on Q1 and Q2, allowing the logic gates 102A–102B to evaluate. When in 'active' mode, the sleep transistors produce a VDDV which is lower than Vdd due to a voltage drop through Q1, and produce a GNDV which is higher than common ground due to a voltage drop through Q2. As a result, the effective voltage seen by the logic circuits 102A–102B is less than the difference between Vdd and common ground. This lower effective voltage increases the evaluation time of CMOS logic gates 102A–102b and therefore reduces the overall speed of the logic circuit 100.

DESCRIPTION OF DRAWINGS

Like reference symbols in the various drawings indicate like elements.

DETAILED DESCRIPTION

So-called 'domino circuits' describe a series of similarly constructed logic blocks within an integrated circuit. Often, the output of one logic block within a domino circuit is connected to the input of the another logic block within the domino circuit.

Figure 1:
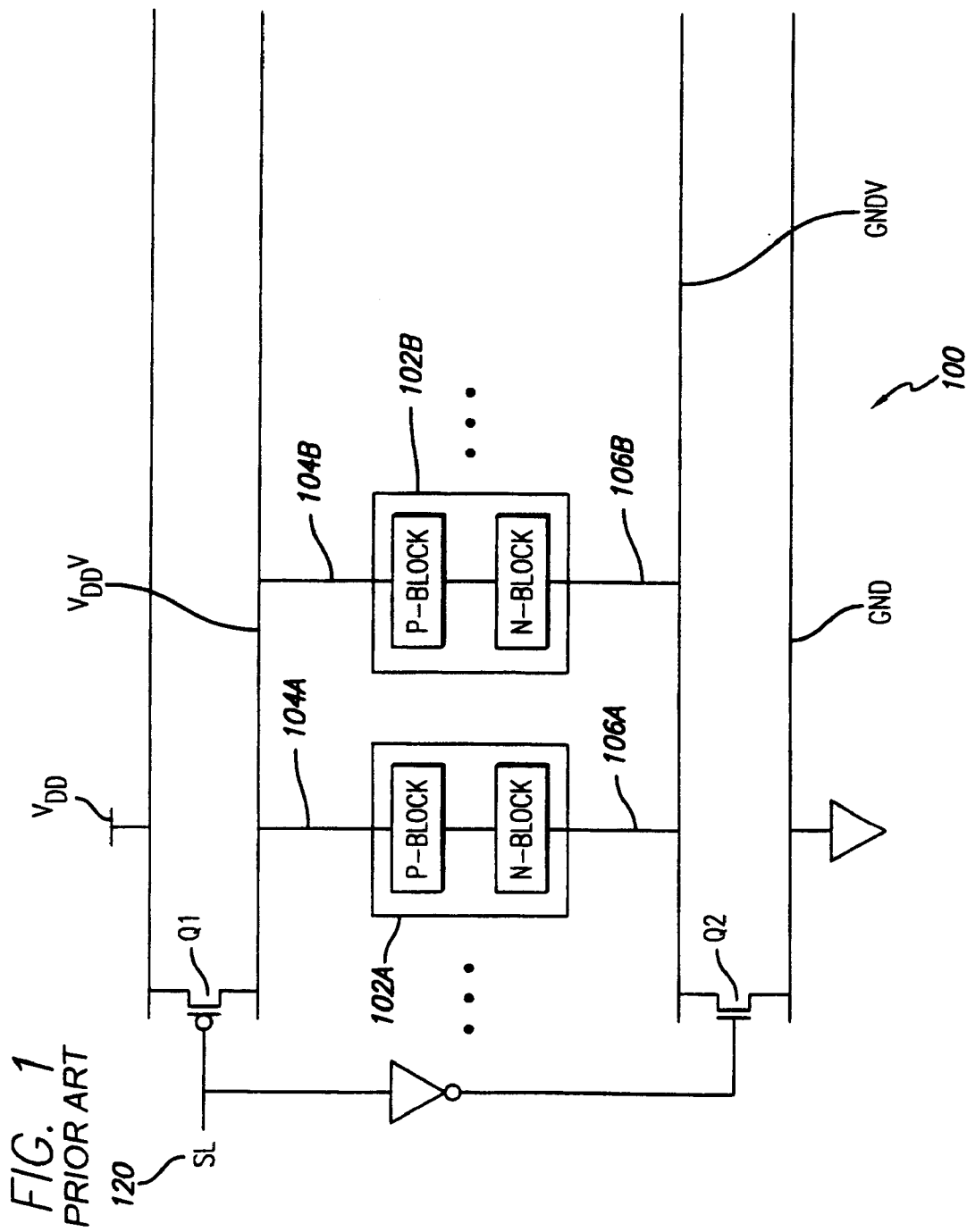
FIG. 1 is a schematic representation of a known way of reducing leakage current in CMOS gates.
Figure 2:
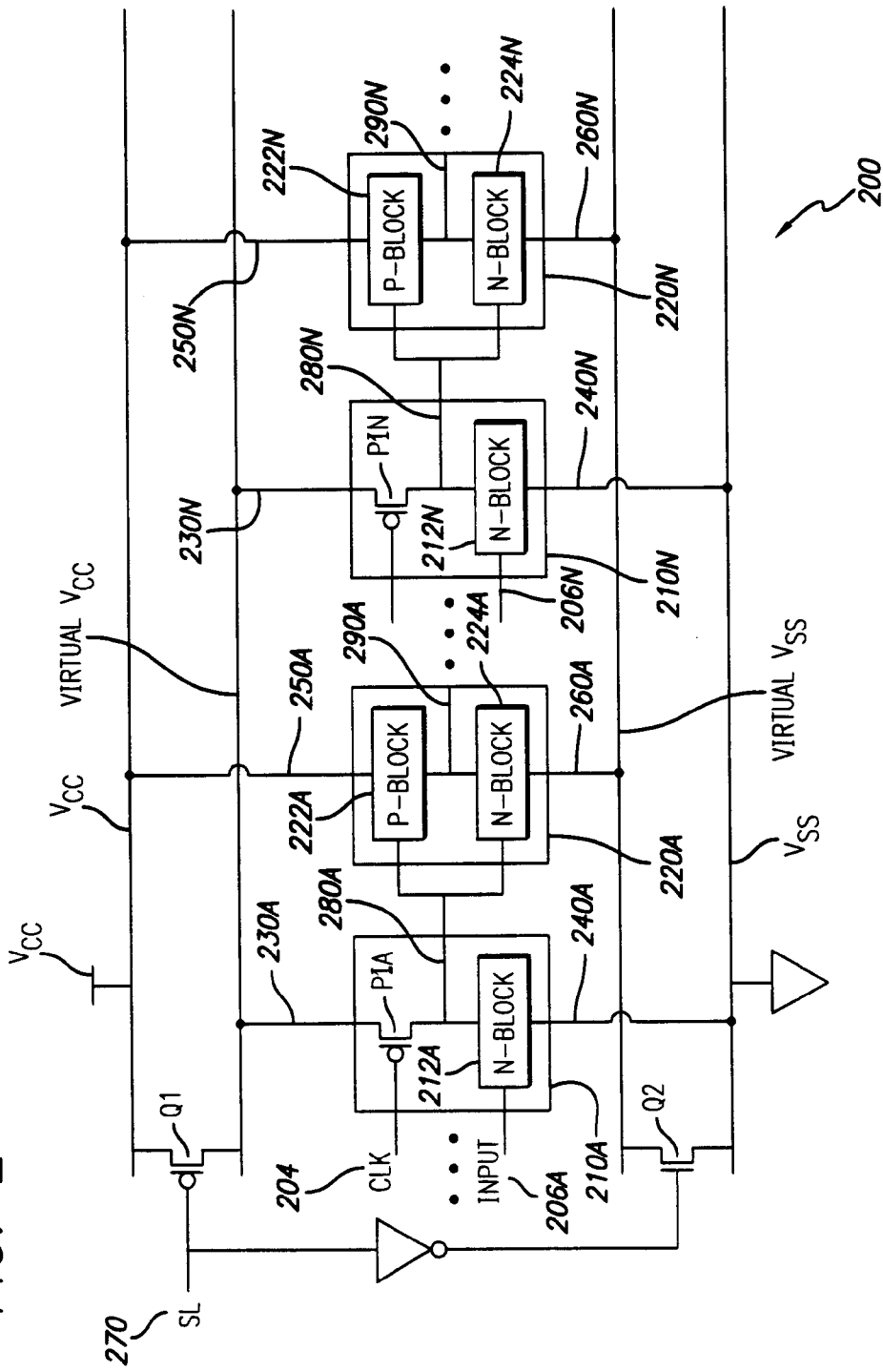
FIG. 2 is a schematic representation of a first embodiment.

Referring to FIG. 2, domino circuit 200 includes blocks of dynamic gates 210A–210N and blocks of static gates 220A–220N with the outputs 280A–280N of the dynamic gates 210A–210N connected, respectively, to the inputs of static gates 220A–220N. The 'dynamic' gates 210A–210N include n-channel transistors, N-Block 212A–212N, which are first pre-charged and then perform logical functions during an evaluation phase.

In an embodiment according to the invention, domino logic circuit 200 includes 'standby' transistors Q1 and Q2 connected to Vcc and Vss, respectively, and establishing 'Virtual Vcc' and 'Virtual Vss' lines.

The dynamic blocks 210A–210N are connected at source terminals 230A–230N of transistors P1A–P1N to 'virtual Vcc' and are connected to ground, Vss, at source terminals 240A–240N of N-block 212A–212N. Static blocks 220A–220N are connected at source terminals 250A–250N of P-blocks 222A–222N to Vcc, and are connected at source terminals 260A–260N of N-blocks 224A–224N to 'virtual Vss'. In 'active' mode, SL is at '0', and standby transistors Q1 and Q2 are turned on, allowing dynamic blocks 210A–210N to pre-charge and evaluate the 206A–206N input signals, and static blocks 220A–220N to evaluate the 130A–130N input signals.

To understand the operation of domino logic circuit 200, consider the following example of the operation of dynamic block 210A and static block 220A. Dynamic block 210A alternates between pre-charge and evaluation phases, according to signal CLK 204, as will be explained. The evaluation time of the dynamic block 210A is largely determined by the transition time of N-block 212 'pull-down' transistors. Because source terminal 240A of N-Block 212 transistors are connected to Vss, the evaluation time of dynamic block 220A is not increased significantly by the virtual Vcc connection 230A to P1. Similarly, the evaluation time of static block 220A is largely determined by the transition time of P-Block 222 'pull-up' transistors. Because source terminal 260A of P-block 222 transistors are connected to Vcc, the evaluation time of the static block 220A is not increased significantly by the virtual Vss connection 250A to N-Block 224. In 'standby' mode, SL is at '1', and Q1 and Q2 are off, so that the leakage current that would otherwise flow through dynamic block 210A is significantly reduced by sleep transistor Q1 being off. Likewise, the leakage current that would otherwise flow through static block 220A is significantly reduced by Q2 being off. Therefore, the domino circuit 200 reduces leakage current while maintaining high speed in domino circuits.

For an integrated circuit, such as a microprocessor, circuit 200 may be placed in 'active' mode for several successive pre-charge and evaluation phases of blocks 210A–210N and 220A–220N and then placed in 'standby' mode for long periods of time. Alternatively, the sleep transistors could be turned on and off before and after each successive evaluation phase.

To understand the operation of dynamic blocks 210A–210N and static blocks 220A–220N during pre-charge and evaluation phases, consider the following example of the operation of dynamic block 210A and static block 220A. In operation, in 'active' mode, SL 270 is at logic-level '0', and Q1 and Q2 are on. Therefore, Q1 is ready to 'pull-up' dynamic block 210A, and Q2 is ready to 'pull-down' static block 220A. During the pre-charge phase of dynamic block 210A, CLK 204 goes to '0', P1 is turned on, pre-charging ('pulling up') the output 280A to 'virtual Vcc'. During the evaluation phase of dynamic block 210A, CLK 106 goes to '1', P1 is turned off, and the output voltage 280A of N-block 212 is either discharged by the N-block 212 transistors or left high depending on the INPUT 206 signals to N-block 212. Static block 220A can now evaluate input 280A from dynamic block 210A, because Q2 is already on and ready to pull-down N-Block 224 p-channel transistors depending on the evaluation of input 280A. Output 290A, from static block 220A is then delivered to the next dynamic block, 210B.

Figure 3:
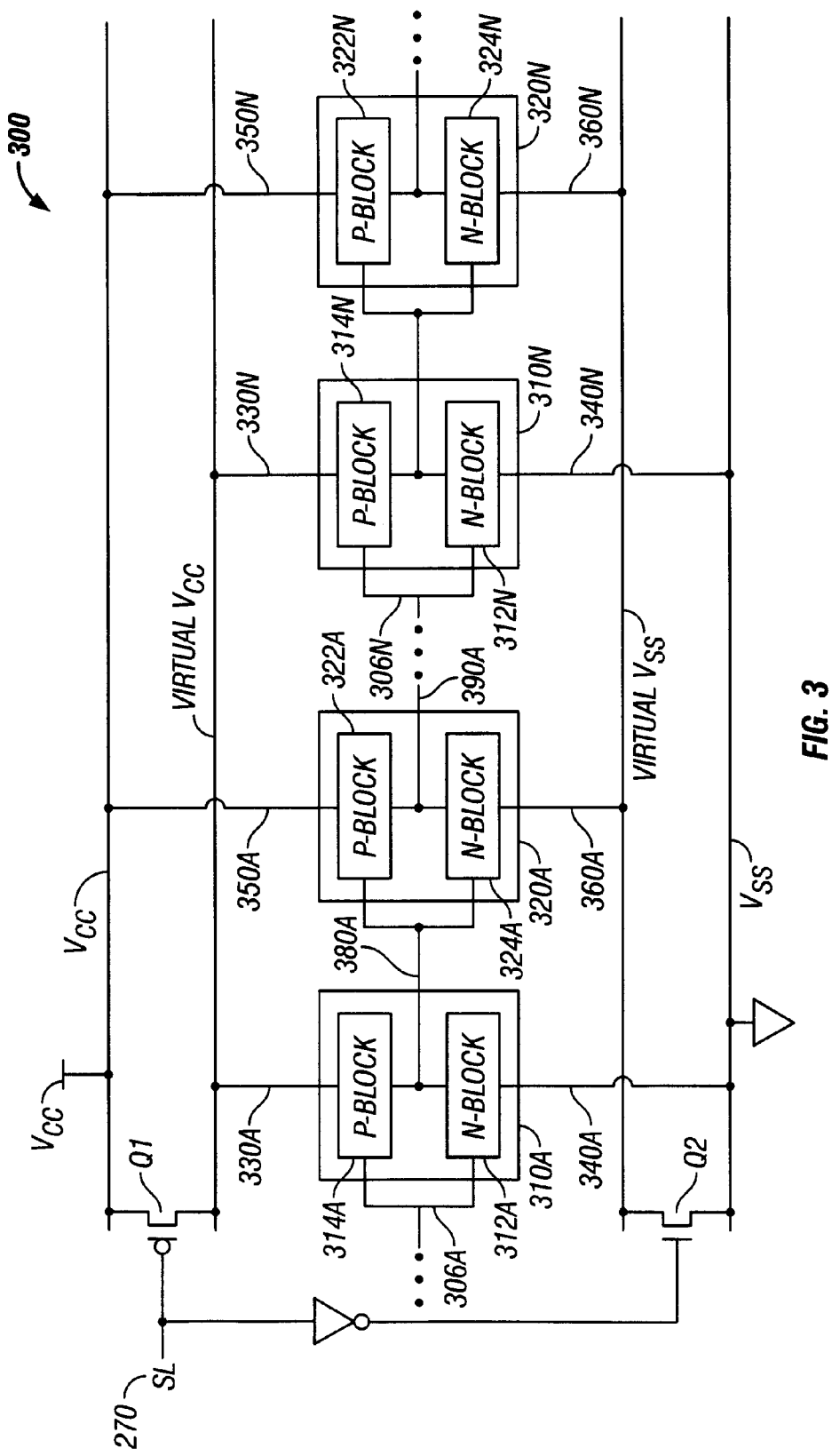
FIG. 3 is a schematic representation of a second embodiment.

Referring to FIG. 3, a circuit 300 includes a series of primary CMOS logic blocks 310A–310N and secondary CMOS logic blocks 320A–320N, with the outputs 380A–380N of primary block 310A–310N connected, respectively, to the inputs of secondary logic blocks 320A–320N. The outputs 390A–390N of the secondary logic blocks 320A–320N are connected to the inputs 306B–306N of other primary logic blocks 310B–310N.

Domino logic circuit 300 includes 'standby' transistors Q1 and Q2, connected at their source terminals to Vcc and Vss, respectively, and establishing 'Virtual Vcc' and 'Virtual Vss' lines. Primary blocks 310A–310N are connected at source terminals 330A–330N of P-Block 314A–314N to 'virtual Vcc', and connected to ground, Vss, at the source terminals 340A–340N of N-block 312A–312N. Secondary blocks 320A–320N are connected at source terminals 350A–350N of P-block 322A–322N to Vcc, and connected at source terminals 360A–360N of N-block 324A–324N to 'virtual Vss'. In 'active' mode, SL is at logic-level '0', and standby transistors Q1 and Q2 are turned on, allowing primary blocks 310A–310N to evaluate input 306A–306N, and secondary blocks 320A–320N to evaluate input 380A–380N input signals. To explain the operation of circuit 300, consider the following example of the operation of primary block 310A and secondary block 320A.

Output 380A is first pre-set to a logic-level '1' by setting input 306A to '0'. Therefore, output 380A of primary block 310A can only make a '1'-to-'0' transition. Output 380A at '1' sets the output 390A of CMOS block 320A to '0'. Therefore, secondary block 320A can only make a '0'-to-'1' transition at output 390A. The evaluation time of primary block 310A during a '1'-to-'0' transition at output 380A, is largely determined by the transition time of N-Block 312A transistors. Because source terminals 340A of N-Block 210A are connected to Vss, the evaluation time during a '1'-to'0' transition of primary block 310A is not increased significantly. Similarly, the evaluation time of secondary block 320A during a '0'-to-'1' transition at output 390A, is largely determined by the transition time of P-Block 322A transistors. Because source terminals 350A of P-Block 322A transistors are connected to Vcc, the evaluation time during a '0'-to'1' transition of secondary block 320A is not increased significantly.

In 'standby' mode, SL is '1', Q1 and Q2 are off, so that the leakage current that would otherwise flow through primary block 310A is significantly reduced by sleep transistor Q1 being off. Likewise, the leakage current that would otherwise flow through secondary block 320A is significantly reduced by Q2 being off. Therefore, circuit 300 reduces leakage current while maintaining high speed in domino-CMOS circuits.

Several separate domino circuits, such as those shown in FIG. 2. and FIG. 3, could be included on a single integrated circuit. Each domino circuit could then be controlled separately, i.e., each domino circuit being put into 'sleep' or 'active' mode as required.

What is claimed is:

1. An apparatus comprising:
   a supply voltage line,
   a virtual supply voltage line,
   a ground voltage line,
   a virtual ground voltage line,
   a dynamic logic circuit directly coupled to the ground voltage line and selectively coupled to the virtual supply voltage line,
   a first logic circuit coupled to the supply voltage line and selectively coupled to the virtual ground voltage line, and
   a switch circuit configured to control the selective coupling of the dynamic logic circuit to the virtual supply line voltage and the first logic circuit to the virtual ground voltage line.

2. The apparatus of claim 1 in which the switch circuit further comprises:
   a first transistor coupled to the supply voltage line and the virtual supply voltage line, the first transistor having a gate input controllable by a standby signal, and
   a second transistor coupled to the ground voltage line and the virtual ground voltage line, the second transistor having a gate input controllable by the standby signal.

3. The apparatus of claim 2 in which the dynamic logic circuit further comprises a pre-charge transistor, the pre-charge transistor having a gate input connected to a clock signal, the clock signal governing the pre-charge and evaluation phases of the dynamic logic circuit.

4. The apparatus of claim 3 in which the standby signal is provided to turn on the first and second transistors prior to the pre-charge phase of the dynamic circuit.

5. The apparatus of claim 1 in which the dynamic logic circuit further comprises an output port for delivering a first evaluated signal to the first logic circuit.

6. The apparatus of claim 5 in which the first logic circuit further comprises:
   an input port to receive the first evaluated signal, and
   an output port to deliver a second evaluated signal to a target circuit.

7. The apparatus of claim 6 in which the standby signal is provided to turn on the first and second transistors for a single evaluation cycle of the dynamic and first logic circuits.

8. The apparatus of claim 6 in which the standby signal is provided to turn on the first and second transistors for multiple evaluation cycles of the dynamic and first logic circuits.

9. The apparatus of claim 6 in which the first logic circuit further comprises a CMOS logic circuit that uses the first evaluated signal received from the dynamic logic circuit to evaluate and deliver the second evaluated signal to the target circuit.

10. The apparatus of claim 9 in which the target circuit comprises a second dynamic circuit in a domino circuit.

11. The apparatus of claim 6 in which the target circuit comprises a second CMOS logic circuit.

12. A method of controlling power to a domino circuit comprising:
   providing, during an active mode, Vss and Virtual Vcc to a dynamic logic circuit, and
   providing Vcc and Virtual Vss to a second logic circuit, and
   disconnecting power from the Virtual Vcc and Virtual Vss during a sleep mode.

13. The method of claim 12 in which disconnecting power to Virtual Vcc and Virtual Vss during the sleep mode further comprises:

connecting a first sleep transistor between Vcc and Virtual Vcc, connecting a second sleep transistor between Vss and Virtual Vss, and turning off the first sleep transistor and the second sleep transistor during the sleep mode.

14. The method of claim 13 in which providing power further comprises:

turning on the first sleep transistor and the second sleep transistor during the active mode.

* * * * *